United States Patent [19]

Marsing et al.

[11] 4,024,363
[45] May 17, 1977

[54] SHORTING CONTACTS FOR CLOSING A SUPERCONDUCTING CURRENT PATH OPERATED BY A BELLOWS ARRANGEMENT RESPONSIVE TO THE PRESSURE OF A CRYOGENIC MEDIUM USED IN COOLING THE CONTACTS

[75] Inventors: Helmut Marsing, Neunkirchen A.B.; Claus-Peter Parsch, Erlangen; Holger Franksen, Erlangen-Eltersdorf, all of Germany

[73] Assignee: Siemens Aktiengesellschaft, Munich, Germany

[22] Filed: Nov. 25, 1975

[21] Appl. No.: 635,124

Related U.S. Application Data

[63] Continuation of Ser. No. 464,240, April 25, 1974, abandoned.

[30] Foreign Application Priority Data

May 14, 1973 Germany .......................... 2324371

[52] U.S. Cl. .............................. 200/83 C; 335/216; 20/289; 200/83 L; 200/83 N; 174/15 C
[51] Int. Cl.² .................... H01H 1/62; H01H 35/32
[58] Field of Search ............... 340/173.1; 317/11 E; 335/216; 174/15 C, DIG. 6; 338/32 S; 200/83 R, 83 A, 83 C, 83 D, 83 L, 83 N, 144 AD, 146 R, 268, 289, 81 R

[56] References Cited

UNITED STATES PATENTS

| 2,355,894 | 8/1944 | Ray ................................... 200/83 L |
| 2,757,361 | 7/1956 | Cameron ......................... 200/83 C |
| 3,267,233 | 8/1966 | Basile .............................. 200/83 N |
| 3,440,376 | 4/1969 | Rabinowitz ........................ 200/289 |
| 3,551,861 | 12/1970 | Boom ................................. 335/216 |
| 3,704,391 | 11/1972 | McConnell ....................... 338/32 S |
| 3,809,835 | 5/1974 | Watt ................................ 200/83 N |

Primary Examiner—Gerald P. Tolin
Attorney, Agent, or Firm—Kenyon & Kenyon Reilly Carr & Chapin

[57] ABSTRACT

A shorting element for closing a superconducting current path using contacts of a stabilized superconductor material with the contacts being brought together through the use of a mechanical actuating device, in which the contact surfaces of the contact elements are brought into contact using a pneumatic and/or hydraulic means operated by a pressure medium fed into the interior of at least one spring bellows. The shorting element, which is particularly useful in shorting superconducting magnets, is of a simple design, operationally reliable, and results in small coolant losses from the addition of heat through the shorting element.

14 Claims, 4 Drawing Figures

SHORTING CONTACTS FOR CLOSING A SUPERCONDUCTING CURRENT PATH OPERATED BY A BELLOWS ARRANGEMENT RESPONSIVE TO THE PRESSURE OF A CRYOGENIC MEDIUM USED IN COOLING THE CONTACTS

This is a continuation, of application Ser. No. 464,240 Filed Apr. 25, 1974 now abandoned.

BACKGROUND OF THE INVENTION

This invention relates to superconductors in general and more particularly to an improved arrangement for closing a superconducting current path using contacts of a stabilized superconductor material.

Once the magnetic field of a superconducting coil, and particularly that of a high field intensity magnet coil, has been generated, almost no energy need be supplied to the coil from outside in order to maintain the field. The only energy required to maintain the superconducting state of the coil is that associated with the refrigeration devices needed to keep the conductors cooled down. As a result, once the coil has reached this state, a short circuit can be provided which short circuit will preferably be a superconducting short circuit. Once this is done, the current will flow in the circuit so formed such that it is only very slowly attenuated and the current supply needed for the initial excitation of the coil can be interrupted.

A shorting element of this general type for use with high field intensity magnetic coils is disclosed in "Elektrie," vol. 19, No. 4, pages 176 to 182, (1965). To start with, provision for shorting a coil which is connected to a current supply is made between the two terminals of the coil. The shorting connection is arranted so that during the building-up phase of the magnetic field in the coil, it is in a normal conducting state and thus represents a relatively high resistance. As a result, current flows through the low resistance superconducting coil. In well known fashion, the magnet coil to be shorted is placed in a bath cryostat and surrounded by liquid helium as the coolant. The leads of the coil are brought out of the cryostat to the current supply which is at normal temperature. In addition, protruding from the surface of the helium bath is a yoke-like shorting section which is connected to the terminals of the superconducting coil and which has a heater attached to it. With the heater operating, the shorting section stays in the normal conducting state offering high resistance to the current being supplied to the coil. As a result, the current supply from outside, assuming the inductive counter EMF is not too large, flows only through the superconducting coil whose resistance is substantially smaller than the resistance of the shorting path shunted across it. After initial build-up of the current in the corresponding coil, the heater of the shorting element is switched off and/or liquid helium filled in to the cryostat to such a height that the shorting section is immersed in the cooling medium. As a result, the shorting path makes a transition from the normal conducting to the superconducting state and thus, constitutes a superconducting short circuit for the coil. The current can then circulate in the closed superconducting circuit so formed. The leads of the current supply can then be removed in order to avoid any influx of heat through the leads.

As with any arrangement for shorting a superconducting coil, the above described arrangement does not rely on magnetically controlled shorting elements. These are not practical because of the desired large magnetic fields generated by superconducting coils. An element of this nature is described in U.S. Pat. No. 3,339,165. Since in its operating condition the superconducting contact path of the shorting element should permit the highest possible current densities, very high magnetic field densities must then be applied to the shorting element in order to obtain in it what is referred to as quenching, i.e., the transition from the superconducting to the normal conducting state. If the shorting element is arranged in the vicinity of a high field intensity magnet coil which is to be short circuited, these strong additional fields may have a detrimental effect.

The mode of operation described in the above article from "Elektrie" is used not only to save energy but also because the circulating current in the coil is nearly constant. The current is normally chosen so that a certain margin of safety exists from the critical loading point of the coil. Under these conditions, the decrease of the field or the current with respect of time is very small in this short circuited superconducting coil circuit, i.e., the rate of decline is only approximately a few percent a day. As a result of this type of operation, short circuit magnets of this nature can be used for vehicles which are guided and supported using electrodynamic suspension guidance. In such a system, the vehicle is guided at a high speed along an associated stationary track without contact, the lifting and guidance forces being generated by magnetic interactions.

Superconducting high field intensity magnets are generally manufactured using a stabilized type of construction. In a construction of this nature, a portion of stabilizing material such as copper or aluminum is connected in parallel with the superconducting material so that the total current can temporarily be carried by the stabilization material. Through the use of a stabilizing arrangement, the influence of instabilities in the operation of such magnets can be avoided through design measures such as those described for example in Elektrie, Vol. 21, No. 1, pages 1 to 7 l (1967).

In Elektrie, Vol. 23, No. 3, pages 126–128 (1969), it was noted that a stabilized superconductor which is used as a shorting element of a stabilized superconducting coil can be used only if a section of the conductor is freed of its stabilizing material by a pickling or etching operation, for example. A superconducting section of this nature can furthermore be heated in order to produce quenching therein. Through these two measures, a sufficiently high resistance between the terminal points of the coil winding during the excitation of the high field intensity magnet is obtained.

During the excitation process of the magnet, relatively high helium evaporation losses can occur in such a heated normal conducting section of the shorting element. Furthermore, the stabilizing properties for the short circuit operation of the magnet coil are lost at the point of short circuit due to the pickling or etching operation. Should an accident occur, this can lead to excessive heating of this particular point to a degree such that the conductor melts.

A type of switch which can be mechanically actuated and which contains two contacts is described in German Auslegeschrift 1,615,591. The contact elements which are referred to as a switch reed and a switch block each consist of two strip-shaped stabilized superconductors. The switch has a number of essential mechanical parts as follows: the switch reed; the switch block which receives and seizes the switch reed; a plunger and a member by means of which the switch reed can be set to the switch block; and a shaft by which cams can be operated to bring the conductors of the switch block and the switch reed into contact with each other under pressure using pressure plates. The conductors of the switch reed are rotated approximately 90° with respect to the common switch base plate in the region of the switch block so that the switch reed which is perpendicularly movable at the plunger with respect to the base plate can be moved into the switch block with its conductors perpendicular to the base plate. Similarly with this arrangement, retraction is possible moving in the opposite direction. Thus, for closing the switch, the plunger is pressed down causing the two conductors of the switch reed to be brought into one position relative to the conductors of the switch block. Thereupon, the shaft is rotated in the process of which the cams are operated which then, by means of pressure plates, bring the exposed conductor surfaces into contact with each other under pressure and keep them in this position. It can be seen that the switch described in this reference is a complicated mechanism.

Since large mechanical switching resistance must be overcome where stabilized superconductor ribbons for large currents are used due to the bending of the conductors for the switching process, a sturdy design of the actuating rods of the shaft and the plunger is necessary. These rods, whose one end is at normal temperature, can cause an undesirable introduction of heat into the helium bath used as a cooling medium and as a result, additional helium losses can occur.

Thus, it can be seen that there is a need for an improved element for closing a superconducting current path such as for short circuiting a superconducting magnet, which element is an improvement over the prior art mechanical switch and heated type shorting arrangement of the prior art. Such a device for short circuiting a path in this nature should have a simple mechanism and result in a minimum of helium losses.

SUMMARY OF THE INVENTION

The present invention solves this problem by bringing the contact elements into contact with each other using pneumatic and/or hydraulic means i.e., fluid means operated by a pressure medium.

One primary advantage of the present invention is that pressure lines of small cross section and consisting of material having a low heat conduction such as plastic can be used to conduct the pressure medium. As a result, conduction of heat from the ambient temperature outside to the superconducting temperature of the contacts is very small. Furthermore, the switching operations can be performed in a simple manner by controlling the pressure in the pressure lines.

In a particularly advantageous disclosed embodiment, the actuating device is equipped with a spring bellows, the interior of which is fed with the pressure medium. Switching operations are performed in one embodiment with one spring bellows provided for closing and another for opening the current path. In a further embodiment, one of the spring bellows is replaced with a cup or coil spring so that only one bellows is used. As a result of this arrangement, heat conduction into the cooling medium is further reduced since only a single pressure line for controlling switching operation is necessary.

By using a cryogenic medium such as helium as the pressure medium, the superconducting state in the contacts will be influenced by the pressure medium to a very small degree. As a result, no heat conduction into the helium surrounding the switch is possible. The cooling medium of the switch can thus be used at the same time for cooling the superconducting magnet.

Furthermore, helium, which can be under an excess pressure in the pressure lines, is immediately condensed by the helium surrounding the entire shorting element. Through this advantageous design of the switching element of the present invention, almost no heating of the cooling medium above the temperature of the medium cooling the contacts occurs so that the superconducting state in the contacts will not be affected.

As illustrated, the shorting element is advantageously arranged in the cryostat of the associated superconducting magnet, i.e., the short circuit of the magnet is arranged to be immediately at the terminals of its windings. With this arrangement, the connections between the shorting element and the magnet can be made very short or eliminated altogether. The switch is cooled by the cooling medium of the magnet and only small amounts of coolant are therefor necessary.

DETAILED DESCRIPTION OF THE PREFERRED EMBODIMENT

Figure 1:
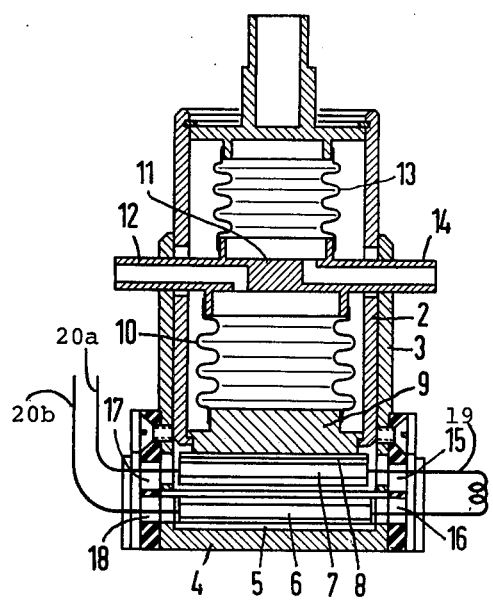
FIG. 1 is a schematic illustration of a pneumatically/hydraulically operable shorting element according to the present invention.

FIG. 1 illustrates a first embodiment of a shorting switch according to the present invention. The illustrated arrangement will preferably be located within a cryostat (not shown on the figure) filled, for example, with liquid helium. This cryostat can be the same cryostat associated with a superconducting high-field intensity magnet. The illustrated shorting element includes a switch housing having a fixed part 3 and a movable part 2. The housing parts 2 and 3 are essentially hollow cylinders of different diameters and are arranged concentric to each other; such that the inner housing part 2 can be moved relative to the outer housing part 3 along a common axis. The housing part 3 includes a base plate 4 on which a plate shaped contact member 6 is attached in an insulated manner, separated by an insulator 5 from the base plate 4. A second contact member 7 is arranged parallel to contact member 6 fastened to a spring bellows 10. The contact member 7 which is of approximately the same contact area of contact member 6 is insulated from the bellows by an insulating member 8, which is attached to the base 9 of the bellows 10. The upper end of the spring bellows 10 is connected to the upper edge of the outer housing part 3 using an attachment member 11 not shown in detail on the figure, and which may, for example, contain fastening screws. The closed interior of the spring bellows 10 is connected to a pressure line 12. Through this pressure line, a pressure medium such as helium can be pumped into the interior of the spring bellows 10 causing it to expand. With one end of the bellows resting against the fixed attachment member 11, the expansion will cause the contact 7 to press against the contact 6. At the upper edge of the inner housing part 2, a further spring bellows 13 is attached. Its lower end is also attached to the attachment member 11 at the upper edge of the outer housing part 3. Its interior is coupled to a second pressure line 14 so that a pressure medium can be fed into the line causing the bellows 13 to expand, pushing the inner housing part 2 upward and separating the contact 6 and 7. Thus, by switching the pressure medium applied between the pressure lines 12 and 14, the contacts can be opened and closed. The contacts are shown as being schematically coupled to a magnet coil 19. As illustrated, connecting lines to the magnet coil 19 can be led out through feedthroughs 15 and 16. On the other side, the contacts are shown as being connected to lines 20a and 20b similarly fed through respective feedthroughs 17 and 18. These connections may be used for initially energizing the magnet from a current source. On the magnet side, the connecting lines will preferably be helium cooled superconductors which in the short circuited operation, are in the superconducting state and therefor will not constitute a damping resistance for the closed circuit consisting of the magnet coil, the connecting lines and the contacts 6 and 7. The magnet coil 19 will initially be energized by applying a current from a current supply over lines 20a and 20b. The current supply will be at a normal temperature. Once the required current is established within the coil 19, the contact 6 and 7 may then be closed and the current supply removed.

One of the spring bellows 10 or 13 can be replaced by a cup or coil spring so that only one of the two pressure lines 12 or 14 will be required. As a result, the design is simplified and there is less possibility of introducing heat.

Figure 2:
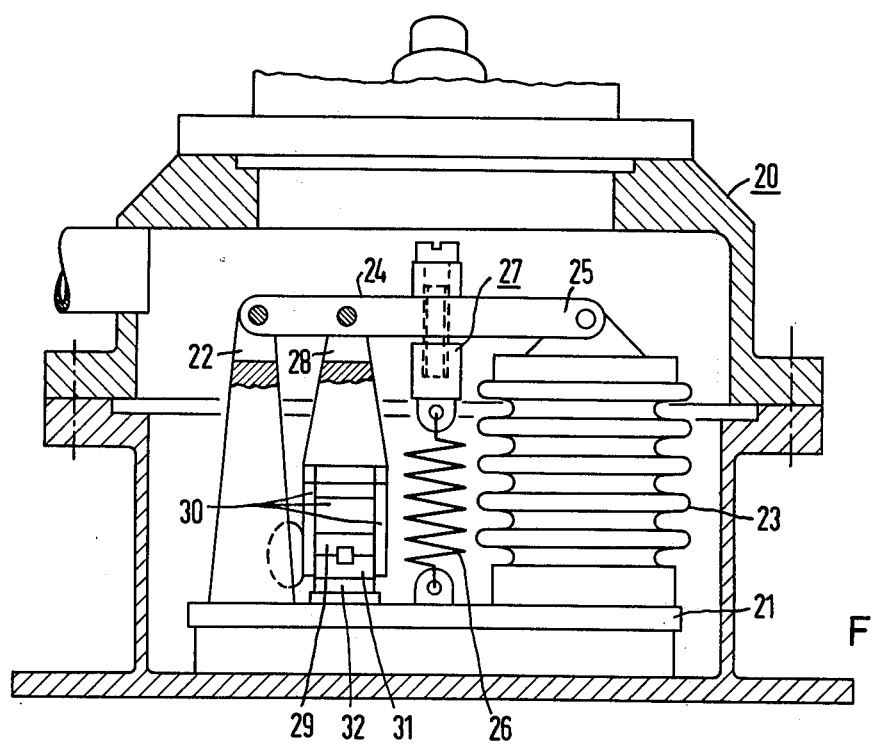
FIG. 2 is a similar view of an alternate embodiment of the present invention.

A further embodiment of the invention is illustrated on FIG. 2. In this case, the shorting element is located within a housing 20 through which a cooling medium such as helium flows. Within the housing 20 there is provided a base plate 21 having mounted to it on one side a spring bellows 23 and on the other side a rigid bearing block 22. The movable end of the spring bellows 23 is connected through a rigid lever 24 to the head of the bearing block 22 in a manner such that the lever end 25 on the spring bellows side can be moved up and down. Upward movement can be obtained by pumping a pressure medium such as liquid helium into the interior of the spring bellows 23 through a pressure line similar to that described above in connection with FIG. 1. The return motion of the lever end 25 is obtained through the use of a helical tension spring 26 which is attached to an adjusting unit 27. The spring 26 will cause a return motion as soon as the internal pressure in the bellows 23 is removed by letting the pressure medium contained therein return through the pressure line. The adjusting unit 27 permits adjustment of the tension spring 26. As illustrated, the tension spring is attached at approximately the center of the lever between the bearing block 22 and the spring bellows 23. Between this point of attachment of the adjusting unit 27 and the lever end connected with the bearing block 22, a fastening element 28 is suspended from the lever 24, which fastening element serves as a connecting member between the lever 24 and a contact 29. The contact 29 is electrically insulated from the fastening element 28, and thus from the other individual parts of the switch, through the use of insulators 30. A downward movement of the lever 24 resulting from the force of the tension spring 26 will cause the contact 29 to be pressed against a contact 31. This contact is also insulated from the base plate 21 through an insulator 32. Thus, in this arrangement, the contact between the contact members 29 and 31 is opened through the use of the spring bellows 23 and closed using the tension spring 26. The contacts can be coupled to the current source and coil in a manner similar to that described above in connection to FIG. 1.

The helium which has a tendency to boil or evaporate in the pressure lines connected to the spring bellows is preferably condensed immediately in the spring bellows which are always located in a helium bath.

Figure 3:
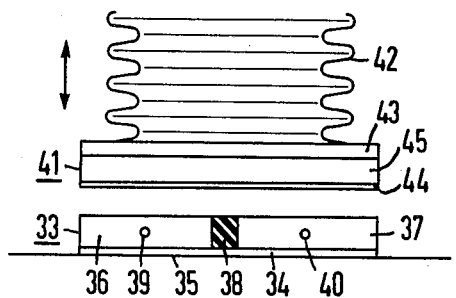
FIG. 3 is a plan view illustrating a first type of contact arrangement according to the present invention.

FIG. 3 illustrates a first embodiment of the contacts 6 and 7 or 29 and 31. In the embodiment shown, a contact plate 33 is attached through an insulator 34 to a switch housing 35, only the upper surface of which is shown on the figure. The contact plate 33 is divided into two halves 36 and 37 which are mechanically joined together through an insulator 38. Each of the halves consists of a highly conductive material such as copper. Into the material, two or more superconducting wires 39 or 40 are worked which wires can then be connected to the terminals of a superconducting magnet coil. The short circuit between the two halves 36 and 37 is obtained by pressing a parallel plate 41, which covers both halves 36 and 37 at least partially, onto the surface of the two contact halves using the type of arrangement described in connection with FIG. 1 or FIG. 2. On FIG. 3, a spring bellows 42 are indicated as being the type of device employed with the plate 41 attached to the bottom free end of the bellows 42 using an insulator 43. The contact plate 41 illustrated on the figure comprises two parallel layers 44 and 45. The layer 44 which contacts the halves 36 and 37 will preferably be at least in part a superconductive material. The layer 45 will be a layer provided for stabilization and made of a normal conducting material such as copper which is in good electrical contact with the layer 44.

Figure 4:
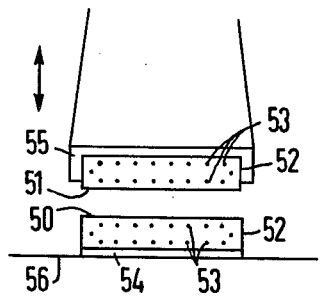
FIG. 4 is a similar view illustrating a second type of contact arrangement according to the present invention.

In the embodiment illustrated on FIG. 4, two contact plates 50 and 51 are each built-up of a so-called multi-core conductor. A conductor such as this will typically comprise a copper matrix 52, of rectangular cross section, containing several thin superconducting wires 53. Multi-core conductors of this nature are also employed in making the windings of superconducting high field intensity magnet coils. Thus, it is very simple to connect the terminals of such a magnet coil directly to the contact plates 50 and 51. The contact plates are insulated from the other portions of the switch by respective insulators 54 and 55. Contact plate 50 is firmly attached to the switch housing 56 with the contact 51 attached to a movable member such as that described above in connection with FIGS. 1 and 2.

Thus, an improved switching arrangement for shorting a superconducting high intensity magnet coil has been shown. Although specific embodiments have been illustrated and described, it will be obvious to those skilled in the art that various modifications may be made without departing from the spirit of the invention which is intended to be limited solely by the appended claims.

What is claimed is:

1. A shorting element for closing the superconducting current path of a superconducting magnet coil cooled by a cryogenic cooling medium comprising:
   a. a set of contacts of a stabilized superconductive material connected in series with the superconducting magnet coil;
   b. a first cryogenic cooling medium at a temperature which will maintain said contacts in a superconducting state surrounding said contacts;
   c. a mechanical actuating device of the type which is response to a fluid pressure mechanically coupled to said contacts for bringing said contacts into contact with each other; and
   d. means for coupling a second cryogenic medium having a temperature at least approximately equal to that of the first cryogenic medium to said mechanical actuating device.

2. Apparatus according to claim 1 wherein said fluid means are pneumatic means.

3. Apparatus according to claim 1 wherein said fluid means are hydraulic means.

4. Apparatus according to claim 1 wherein said fluid means are means responsive to a mixture of a gaseous and a liquid medium.

5. Apparatus according to claim 1 wherein said means comprises a spring bellows and a coil spring.

6. Apparatus according to claim 1 wherein said mechanical actuating device comprises at least one spring bellows and said means supplying said second cryogenic medium comprise means for supplying said second cryogenic medium to the interior of said spring bellows.

7. Apparatus according to claim 1 wherein said means comprises a spring bellows and one of a cup and coil spring.

8. Apparatus according to claim 1 wherein said first cryogenic medium is helium.

9. Apparatus according to claim 1 wherein the cooling medium of the superconducting magnet coil is used as said second cryogenic medium.

10. Apparatus according to claim 9 wherein said superconducting magnet coil is enclosed within means containing said cryogenic cooling medium and wherein said shorting contacts are also enclosed within said same means whereby said first cryogenic medium is the cryogenic cooling medium of said superconducting magnet coil.

11. An improved shorting element for closing the superconducting current path of a superconducting magnet coil cooled by a cryogenic cooling medium comprising:
   a. a first fixed contact made of a stabilized superconductive material coupled to one side of said superconducting coil;
   b. a second movble contact made of a stabilized superconductive material coupled to the other side of superconducting coil;
   c. a first cryogenic medium surrounding said first and second contacts, said cryogenic medium at a temperature maintaining said contacts in the superconducting state;
   d. closing means for bringing said first and second contacts into contact with each other;
   e. opening means for separating said first and second contacts, at least one of said closing and opening means being actuating means responsive to the application of a pressure medium; and
   f. means for supplying a second cryogenic medium at a temperature approximately equal to that of said first cryogenic medium to said actuating means.

12. A shorting element according to claim 11 wherein said fluid means comprises a spring bellows.

13. A shorting element according to claim 12 wherein said closing means comprises a first spring bellows and said opening means comprises a second spring bellows.

14. A shorting element according to claim 13 wherein one of said opening means and closing means comprises a spring bellows and the other of said means comprises a spring.

* * * * *